United States Patent
Kim

(10) Patent No.: US 10,593,386 B2
(45) Date of Patent: Mar. 17, 2020

(54) SEMICONDUCTOR DEVICES

(71) Applicant: SK hynix Inc., Icheon-si Gyeonggi-do (KR)

(72) Inventor: Woongrae Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/200,980

(22) Filed: Nov. 27, 2018

(65) Prior Publication Data

US 2020/0020372 A1 Jan. 16, 2020

(51) Int. Cl.
| | | |
|---|---|---|
| G11C 7/10 | (2006.01) | |
| G11C 8/12 | (2006.01) | |
| G11C 7/22 | (2006.01) | |
| G11C 8/10 | (2006.01) | |
| G11C 8/06 | (2006.01) | |
| G11C 8/18 | (2006.01) | |

(52) U.S. Cl.
CPC .............. *G11C 8/12* (2013.01); *G11C 7/1057* (2013.01); *G11C 7/1063* (2013.01); *G11C 7/1069* (2013.01); *G11C 7/222* (2013.01); *G11C 8/06* (2013.01); *G11C 8/10* (2013.01); *G11C 8/18* (2013.01)

(58) Field of Classification Search
CPC ....... G11C 8/12; G11C 7/1057; G11C 7/1063; G11C 7/1069; G11C 7/222; G11C 8/06; G11C 8/10; G11C 8/18

USPC .................................................... 365/189.05
See application file for complete search history.

(56) References Cited

U.S. PATENT DOCUMENTS

| | | | |
|---|---|---|---|
| 8,325,537 B2 | 12/2012 | Shimizu et al. | |
| 2019/0325929 A1* | 10/2019 | Kim | ........................ G11C 7/12 |

FOREIGN PATENT DOCUMENTS

KR 1020100128638 A 12/2010

* cited by examiner

*Primary Examiner* — Huan Hoang
(74) *Attorney, Agent, or Firm* — William Park & Associates Ltd.

(57) ABSTRACT

A semiconductor device includes a synthesis signal generation circuit, a column control circuit, and a control signal generation circuit. The synthesis signal generation circuit generates a register synthesis signal in response to first and second read pulses sequentially generated during a read operation. The column control circuit generates any one of a first bank selection signal and a second bank selection signal for respectively selecting a first bank group and a second bank group included in a core circuit in response to the first and second read pulses. The control signal generation circuit generates a control signal for controlling an output operation of a mode register in response to the register synthesis signal.

31 Claims, 13 Drawing Sheets

US 10,593,386 B2

SEMICONDUCTOR DEVICES

CROSS-REFERENCE TO RELATED APPLICATIONS

The present application claims priority under 35 U.S.C 119(a) to Korean Application No. 10-2018-0081932, filed on Jul. 13, 2018, which is incorporated herein by reference in its entirety.

BACKGROUND

1. Technical Field

Various embodiments of the present disclosure generally relate to semiconductor devices performing a column operation of a core circuit and a mode register read operation of a mode register circuit.

2. Related Art

In general, a semiconductor device such as a dynamic random access memory (DRAM) device may include a plurality of bank groups comprised of cell arrays which are selected by addresses. Each of the bank groups may be realized to include a plurality of banks. The semiconductor device may select any one of the plurality of bank groups and may perform a column operation for outputting data stored in a cell array included in the selected bank group through input/output (I/O) lines. In addition, the semiconductor device may include a mode register storing operational information and internal information and may perform a mode register read operation to output the information stored in the mode register.

SUMMARY

According to an embodiment, a semiconductor device may include a synthesis signal generation circuit, a column control circuit, and a control signal generation circuit. The synthesis signal generation circuit may generate a register synthesis signal in response to a first read pulse and a second read pulse sequentially generated during a read operation. The column control circuit may generate any one of a first bank selection signal and a second bank selection signal for respectively selecting a first bank group and a second bank group of a core circuit in response to the first read pulse and the second read pulse. The control signal generation circuit may generate a control signal for controlling an output operation of a mode register in response to the register synthesis signal.

According to an embodiment, a semiconductor device may include a synthesis signal generation circuit, a column control circuit, and a control signal generation circuit. The synthesis signal generation circuit may generate a register synthesis signal in response to a read pulse. The column control circuit may generate any one of a first bank selection signal and a second bank selection signal for respectively selecting a first bank group and a second bank group of a core circuit in response to a write pulse or the read pulse. The control signal generation circuit may generate a control signal for controlling an output operation of a mode register in response to the register synthesis signal.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Low power double data rate 5 (LPDDR5) synchronous dynamic random access memory devices may provide a bank group mode, an 8 bank mode, and a 16 bank mode. A bank group may include a plurality of banks. For example, the bank group may include four banks. In the bank group mode, a column operation for one bank included in the bank group may be performed by one command. In the 8 bank mode, column operations for two banks respectively included in separate bank groups are sequentially performed by one command. In the 16 bank mode, column operations for four banks respectively included in separate bank groups are sequentially performed by one command.

Figure 1:
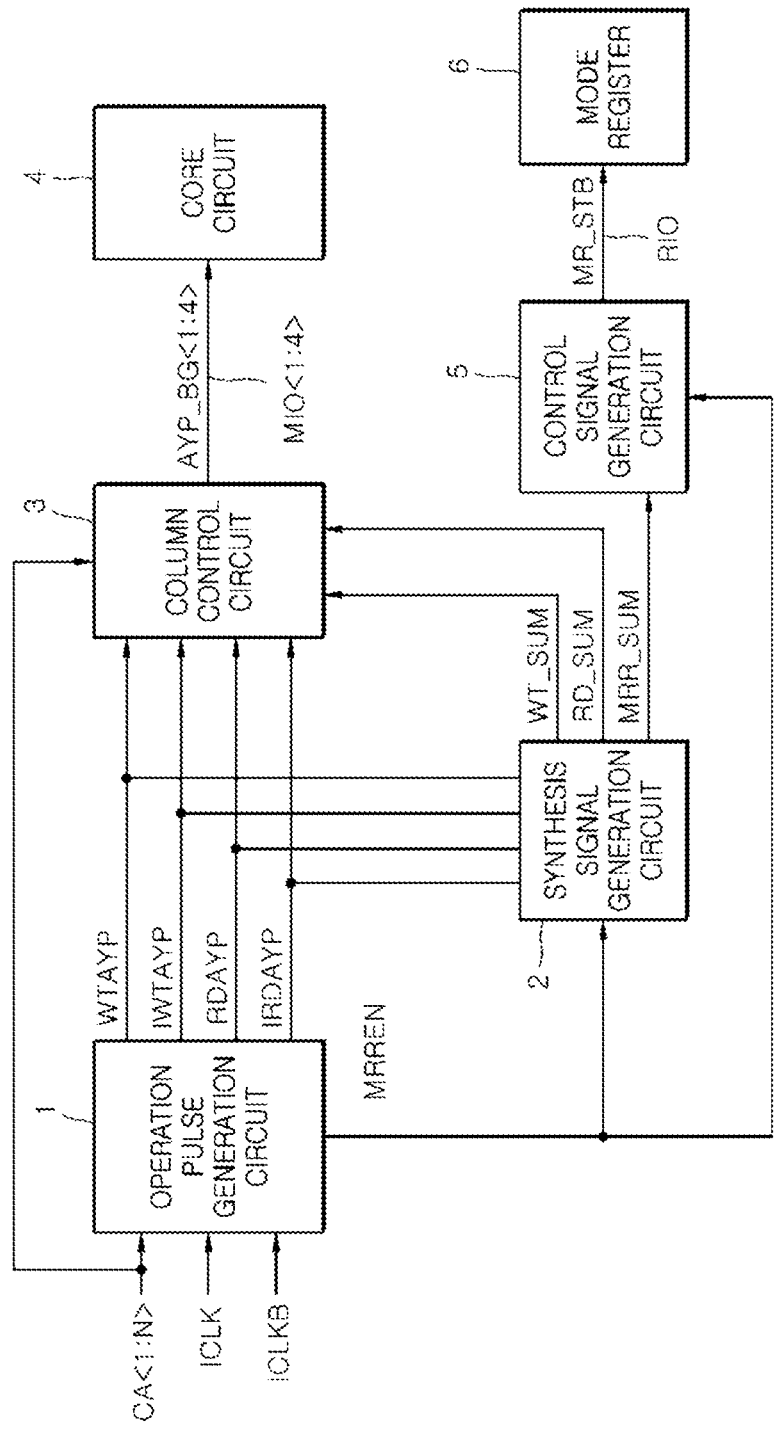
FIG. 1 is a block diagram illustrating a configuration of a semiconductor device according to an embodiment of the present disclosure.

As illustrated in FIG. 1, a semiconductor device according to an embodiment may include an operation pulse generation circuit 1, a synthesis signal generation circuit 2, a column control circuit 3, a core circuit 4, a control signal generation circuit 5, and a mode register 6.

The operation pulse generation circuit 1 may be synchronized with an internal clock signal ICLK and an inverted internal clock signal ICLKB to generate a first write pulse WTAYP and a second write pulse IWTAYP which are sequentially enabled if a command/address signal CA<1:N> has a logic level combination for performing a write operation. The operation pulse generation circuit 1 may decode the command/address signal CA<1:N> in synchronization with the internal clock signal ICLK and the inverted internal clock signal ICLKB to generate the first write pulse WTAYP and the second write pulse IWTAYP which are sequentially enabled. In an embodiment, each of the first write pulse WTAYP and the second write pulse IWTAYP may include a pulse for performing a write operation.

The operation pulse generation circuit 1 may be synchronized with the internal clock signal ICLK and the inverted internal clock signal ICLKB to generate a first read pulse RDAYP and a second read pulse IRDAYP which are sequentially enabled if the command/address signal CA<1:N> has a logic level combination for performing a read operation. The operation pulse generation circuit 1 may decode the command/address signal CA<1:N> in synchronization with the internal clock signal ICLK and the inverted internal clock signal ICLKB to generate the first read pulse RDAYP and the second read pulse IRDAYP which are sequentially enabled. In an embodiment, each of the first read pulse RDAYP and the second read pulse IRDAYP may include a pulse for performing a read operation.

The operation pulse generation circuit 1 may be synchronized with the internal clock signal ICLK and the inverted internal clock signal ICLKB to generate a register enablement signal MRREN which is enabled if the command/address signal CA<1:N> has a logic level combination for performing a mode register read operation. The operation pulse generation circuit 1 may decode the command/address signal CA<1:N> in synchronization with the internal clock signal ICLK and the inverted internal clock signal ICLKB to generate the register enablement signal MRREN. In an embodiment, the register enablement signal MRREN may include a pulse for performing a mode register read operation.

The synthesis signal generation circuit 2 may generate a write synthesis signal WT_SUM in response to the first write pulse WTAYP and the second write pulse IWTAYP. The synthesis signal generation circuit 2 may generate the write synthesis signal WT_SUM which is enabled if any one of the first write pulse WTAYP and the second write pulse IWTAYP is created.

The synthesis signal generation circuit 2 may generate a read synthesis signal RD_SUM in response to the first read pulse RDAYP and the second read pulse IRDAYP. The synthesis signal generation circuit 2 may generate the read synthesis signal RD_SUM which is enabled if any one of the first read pulse RDAYP and the second read pulse IRDAYP is created.

The synthesis signal generation circuit 2 may interrupt generation of the read synthesis signal RD_SUM in response to the register enablement signal MRREN. The synthesis signal generation circuit 2 may generate the read synthesis signal RD_SUM which is disabled if the register enablement signal MRREN is enabled.

The synthesis signal generation circuit 2 may generate a register synthesis signal MRR_SUM in response to the first read pulse RDAYP and the second read pulse IRDAYP. The synthesis signal generation circuit 2 may generate the register synthesis signal MRR_SUM which is enabled if any one of the first read pulse RDAYP and the second read pulse IRDAYP is created.

The column control circuit 3 may generate any one of a first bank selection signal AYP_BG<1>, a second bank selection signal AYP_BG<2>, a third bank selection signal AYP_BG<3>, and a fourth bank selection signal AYP_BG<4> in response to the first write pulse WTAYP.

The column control circuit 3 may generate any one of the first bank selection signal AYP_BG<1>, the second bank selection signal AYP_BG<2>, the third bank selection signal AYP_BG<3>, and the fourth bank selection signal AYP_BG<4> according to the command/address signal CA<1:N> in response to the first write pulse WTAYP. The column control circuit 3 may generate any one of the first bank selection signal AYP_BG<1>, the second bank selection signal AYP_BG<2>, the third bank selection signal AYP_BG<3>, and the fourth bank selection signal AYP_BG<4> in response to the second write pulse IWTAYP. The column control circuit 3 may generate any one of the first bank selection signal AYP_BG<1>, the second bank selection signal AYP_BG<2>, the third bank selection signal AYP_BG<3>, and the fourth bank selection signal AYP_BG<4> according to the command/address signal CA<1:N> in response to the second write pulse IWTAYP.

Any one of the first to fourth bank selection signals AYP_BG<1:4>, which is generated by the column control circuit 3 in response to the first write pulse WTAYP, may be a different signal from any one of the first to fourth bank selection signals AYP_BG<1:4>, which is generated by the column control circuit 3 in response to the second write pulse IWTAYP. For example, if the first bank selection signal AYP_BG<1> is enabled by the column control circuit 3 in response to the first write pulse WTAYP, any one of the second to fourth bank selection signals AYP_BG<2:4> may be enabled by the column control circuit 3 in response to the second write pulse IWTAYP.

The column control circuit 3 may generate any one of the first bank selection signal AYP_BG<1>, the second bank selection signal AYP_BG<2>, the third bank selection signal AYP_BG<3>, and the fourth bank selection signal AYP_BG<4> in response to the first read pulse RDAYP. The column control circuit 3 may generate any one of the first bank selection signal AYP_BG<1>, the second bank selection signal AYP_BG<2>, the third bank selection signal AYP_BG<3>, and the fourth bank selection signal AYP_BG<4> according to the command/address signal CA<1:N> in response to the first read pulse RDAYP. The column control circuit 3 may generate any one of the first bank selection signal AYP_BG<1>, the second bank selection signal AYP_BG<2>, the third bank selection signal AYP_BG<3>, and the fourth bank selection signal AYP_BG<4> in response to the second read pulse IRDAYP. The column control circuit 3 may generate any one of the first bank selection signal AYP_BG<1>, the second bank selection signal AYP_BG<2>, the third bank selection signal AYP_BG<3>, and the fourth bank selection signal AYP_BG<4> according to the command/address signal CA<1:N> in response to the second read pulse IRDAYP.

Any one of the first to fourth bank selection signals AYP_BG<1:4>, which is generated by the column control circuit 3 in response to the first read pulse RDAYP, may be a different signal from any one of the first to fourth bank selection signals AYP_BG<1:4>, which is generated by the column control circuit 3 in response to the second read pulse IRDAYP. For example, if the fourth bank selection signal AYP_BG<4> is enabled by the column control circuit 3 in response to the first read pulse RDAYP, any one of the first to third bank selection signals AYP_BG<1:3> may be enabled by the column control circuit 3 in response to the second read pulse IRDAYP.

The first bank selection signal AYP_BG<1> may be a signal for performing a column operation of a first bank group (41 of FIG. 10) included in the core circuit 4. The first bank selection signal AYP_BG<1> may be transmitted to the core circuit 4 through a first memory input/output (I/O) line MIO<1>. The second bank selection signal AYP_BG<2> may be a signal for performing the column operation of a second bank group (42 of FIG. 10) included in the core circuit 4. The second bank selection signal AYP_BG<2> may be transmitted to the core circuit 4 through a second memory input/output (I/O) line MIO<2>. The third bank selection signal AYP_BG<3> may be a signal for performing the column operation of a third bank group (43 of FIG. 10) included in the core circuit 4. The third bank selection signal AYP_BG<3> may be transmitted to the core circuit 4 through a third memory input/output (I/O) line MIO<3>. The fourth bank selection signal AYP_BG<4> may be a signal for performing the column operation of a fourth bank group (44 of FIG. 10) included in the core circuit 4. The fourth bank selection signal AYP_BG<4> may be transmitted to the core circuit 4 through a fourth memory input/output (I/O) line MIO<4>.

Figure 10:
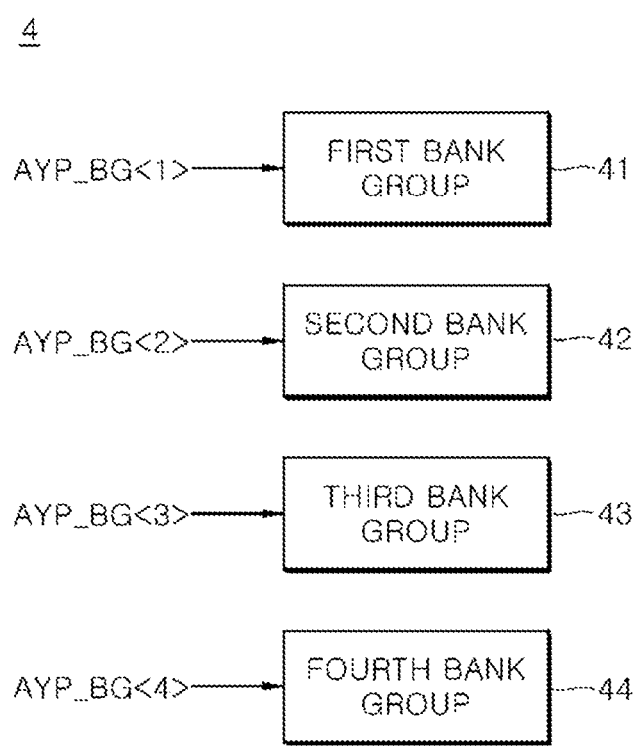
FIG. 10 is a block diagram illustrating a configuration of a core circuit included in the semiconductor device of FIG. 1.

The core circuit 4 may include the first bank group (41 of FIG. 10), the second bank group (42 of FIG. 10), the third bank group (43 of FIG. 10), and the fourth bank group (44 of FIG. 10). The core circuit 4 may perform the column operation of the first bank group (41 of FIG. 10) if the first bank selection signal AYP_BG<1> is enabled. The core circuit 4 may perform the column operation of the second bank group (42 of FIG. 10) if the second bank selection signal AYP_BG<2> is enabled. The core circuit 4 may perform the column operation of the third bank group (43 of FIG. 10) if the third bank selection signal AYP_BG<3> is enabled. The core circuit 4 may perform the column operation of the fourth bank group (44 of FIG. 10) if the fourth bank selection signal AYP_BG<4> is enabled. The column operation may include the write operation for storing data into the core circuit 4 and the read operation for outputting the data stored in the core circuit 4.

The control signal generation circuit 5 may generate a control signal MR_STB which is enabled in response to the register synthesis signal MRR_SUM. The control signal generation circuit 5 may latch the register enablement signal MRREN in response to the register synthesis signal MRR_SUM to generate the control signal MR_STB. The control signal MR_STB may be transmitted to the mode register 6 through a register input/output (I/O) line RIO.

All of the first to fourth memory I/O lines MIO<1:4> may have the same length, that is, a first length. The register I/O line RIO may have a second length. The first length may be set to be greater than the second length.

The mode register 6 may be realized to include a plurality of registers. The mode register 6 may perform the mode register read operation in response to the control signal MR_STB. The mode register 6 may output operational information and internal information if the control signal MR_STB is enabled.

Figure 2:
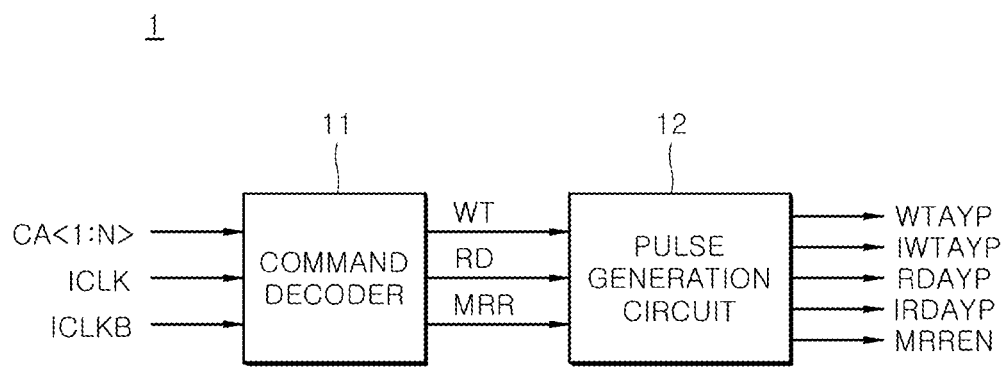
FIG. 2 is a block diagram illustrating a configuration of an operation pulse generation circuit included in the semiconductor device of FIG. 1.

Referring to FIG. 2, the operation pulse generation circuit 1 may include a command decoder 11 and a pulse generation circuit 12.

The command decoder 11 may be synchronized with the internal clock signal ICLK and the inverted internal clock signal ICLKB to generate a write signal WT which is enabled if the command/address signal CA<1:N> has a logic level combination for performing the write operation. The command decoder 11 may be synchronized with the internal clock signal ICLK and the inverted internal clock signal ICLKB to generate the write signal WT including pulses which are periodically created if the command/address signal CA<1:N> has a logic level combination for performing the write operation. The command decoder 11 may decode the command/address signal CA<1:N> in synchronization with the internal clock signal ICLK and the inverted internal clock signal ICLKB to generate the write signal WT.

The command decoder 11 may be synchronized with the internal clock signal ICLK and the inverted internal clock signal ICLKB to generate a read signal RD which is enabled if the command/address signal CA<1:N> has a logic level combination for performing the read operation. The command decoder 11 may be synchronized with the internal clock signal ICLK and the inverted internal clock signal ICLKB to generate the read signal RD including pulses which are periodically created if the command/address signal CA<1:N> has a logic level combination for performing the read operation. The command decoder 11 may decode the command/address signal CA<1:N> in synchronization with the internal clock signal ICLK and the inverted internal clock signal ICLKB to generate the read signal RD.

The command decoder 11 may be synchronized with the internal clock signal ICLK and the inverted internal clock signal ICLKB to generate a mode register read signal MRR which is enabled if the command/address signal CA<1:N> has a logic level combination for performing the mode register read operation. The command decoder 11 may be synchronized with the internal clock signal ICLK and the inverted internal clock signal ICLKB to generate the mode register read signal MRR including a pulse which is created if the command/address signal CA<1:N> has a logic level combination for performing the mode register read operation. The command decoder 11 may decode the command/address signal CA<1:N> in synchronization with the internal clock signal ICLK and the inverted internal clock signal ICLKB to generate the mode register read signal MRR.

The pulse generation circuit 12 may generate the first write pulse WTAYP and the second write pulse IWTAYP which are sequentially enabled in response to the write signal WT. The pulse generation circuit 12 may generate the second write pulse IWTAYP after the first write pulse WTAYP is generated in response to the pulses of the write signal WT. A period from a moment that the first write pulse WTAYP is enabled till a moment that the second write pulse IWTAYP is enabled may be set as a burst length period.

The pulse generation circuit 12 may generate the first read pulse RDAYP and the second read pulse IRDAYP which are sequentially enabled in response to the read signal RD. The pulse generation circuit 12 may generate the second read pulse IRDAYP after the first read RDAYP is generated in response to the pulses of the read signal RD. A period from a moment that the first read pulse RDAYP is enabled till a moment that the second read pulse IRDAYP is enabled may be set as the burst length period.

The pulse generation circuit 12 may generate the register enablement signal MRREN which is enabled in response to the mode register read signal MRR. The pulse generation circuit 12 may generate the register enablement signal MRREN which is enabled in response to a pulse of the mode register read signal MRR.

Figure 3:
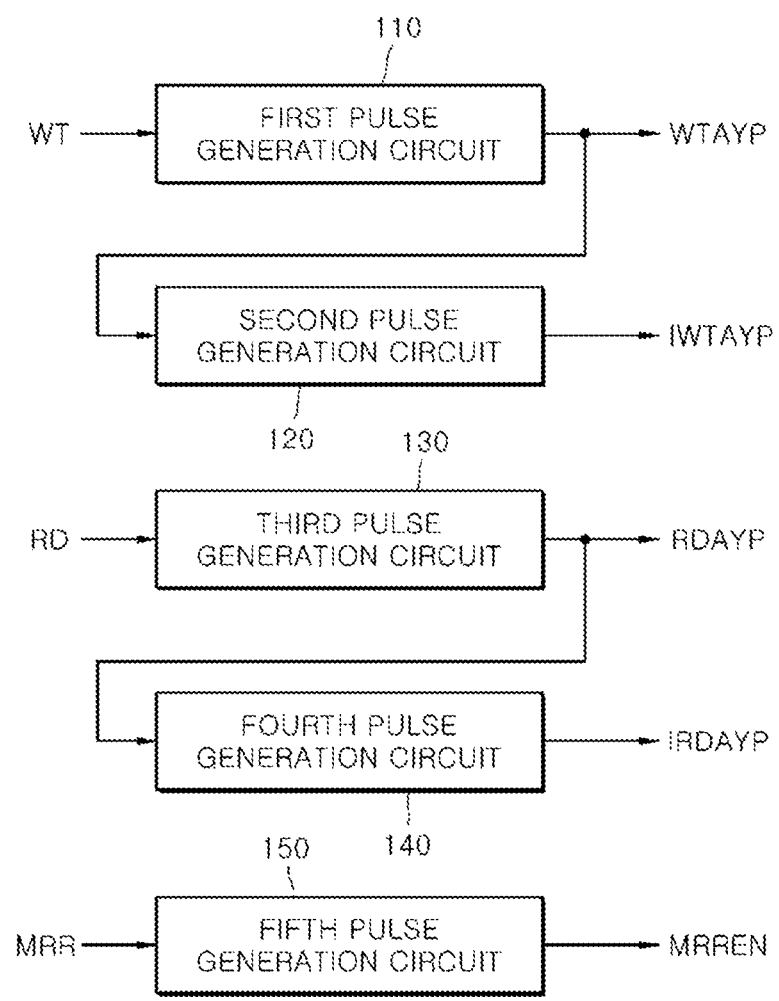
FIG. 3 is a block diagram illustrating a configuration of a pulse generation circuit included in the operation pulse generation circuit of FIG. 2.

Referring to FIG. 3, the pulse generation circuit 12 may include a first pulse generation circuit 110, a second pulse generation circuit 120, a third pulse generation circuit 130, a fourth pulse generation circuit 140, and a fifth pulse generation circuit 150.

The first pulse generation circuit 110 may generate the first write pulse WTAYP which is enabled in response to the write signal WT. The first pulse generation circuit 110 may generate the first write pulse WTAYP including a pulse which is created after a predetermined period elapses from a point of time that a pulse of the write signal WT is inputted to the first pulse generation circuit 110. For example, the first pulse generation circuit 110 may generate the first write pulse WTAYP including a pulse which is created after a predetermined period elapses from a point of time that the write signal WT is enabled.

The second pulse generation circuit 120 may generate the second write pulse IWTAYP which is enabled in response to the first write pulse WTAYP. The second pulse generation circuit 120 may generate the second write pulse IWTAYP including a pulse which is created after a predetermined period elapses from a point of time that the first write pulse WTAYP is inputted to the second pulse generation circuit 120. For example, the second pulse generation circuit 120 may generate the second write pulse IWTAYP including a pulse which is created after a predetermined period elapses from a point of time that the first write pulse WTAYP is created.

The third pulse generation circuit 130 may generate the first read pulse RDAYP which is enabled in response to the read signal RD. The third pulse generation circuit 130 may generate the first read pulse RDAYP including a pulse which is created after a predetermined period elapses from a point of time that a pulse of the read signal RD is inputted to the third pulse generation circuit 130. For example, the third pulse generation circuit 130 may generate the first read pulse RDAYP including a pulse which is created after a predetermined period elapses from a point of time that the read signal RD is enabled.

The fourth pulse generation circuit 140 may generate the second read pulse IRDAYP which is enabled in response to the first read pulse RDAYP. The fourth pulse generation circuit 140 may generate the second read pulse IRDAYP including a pulse which is created after a predetermined period elapses from a point of time that the first read pulse RDAYP is inputted to the fourth pulse generation circuit 140. For example, the fourth pulse generation circuit 140 may generate the second read pulse IRDAYP including a pulse which is created after a predetermined period elapses from a point of time that the first read pulse RDAYP is created.

The fifth pulse generation circuit 150 may generate the register enablement signal MRREN which is enabled in response to the mode register read signal MRR. The fifth pulse generation circuit 150 may generate the register enablement signal MRREN including a pulse which is created after a predetermined period elapses from a point of time that a pulse of the mode register read signal MRR is inputted to the fifth pulse generation circuit 150. For example, the fifth pulse generation circuit 150 may generate the register enablement signal MRREN including a pulse which is created after a predetermined period elapses from a point of time that a pulse of the mode register read signal MRR is enabled.

Figure 4:
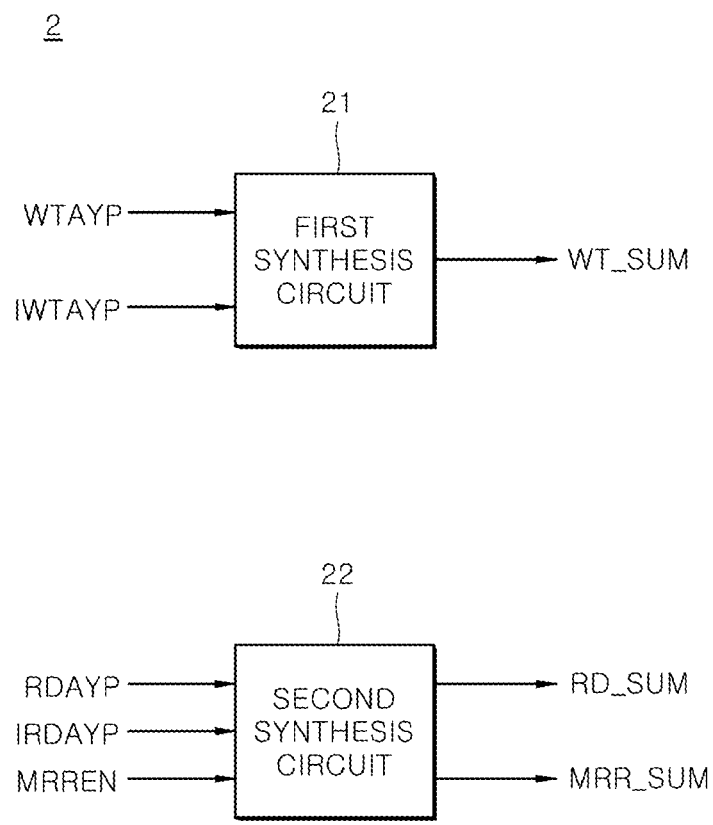
FIG. 4 is a block diagram illustrating a configuration of a synthesis signal generation circuit included in the semiconductor device of FIG. 1.

Referring to FIG. 4, the synthesis signal generation circuit 2 may include a first synthesis circuit 21 and a second synthesis circuit 22.

The first synthesis circuit 21 may generate the write synthesis signal WT_SUM which is enabled after a predetermined period elapses from a point of time that the first write pulse WTAYP or the second write pulse IWTAYP is inputted to the first synthesis circuit 21. The first synthesis circuit 21 may generate the write synthesis signal WT_SUM which is enabled after a predetermined period elapses from a point of time that the first write pulse WTAYP is inputted to the first synthesis circuit 21. The first synthesis circuit 21 may generate the write synthesis signal WT_SUM which is enabled after a predetermined period elapses from a point of time that the second write pulse IWTAYP is inputted to the first synthesis circuit 21. The first synthesis circuit 21 may perform a logical OR operation of the first write pulse WTAYP and the second write pulse IWTAYP to generate the write synthesis signal WT_SUM.

The second synthesis circuit 22 may generate the read synthesis signal RD_SUM which is enabled after a predetermined period elapses from a point of time that the first read pulse RDAYP or the second read pulse IRDAYP is inputted to the second synthesis circuit 22. The second synthesis circuit 22 may interrupt generation of the read synthesis signal RD_SUM in response to the register enablement signal MRREN. The second synthesis circuit 22 may generate the register synthesis signal MRR_SUM which is enabled after a predetermined period elapses from a point of time that the first read pulse RDAYP or the second read pulse IRDAYP is inputted to the second synthesis circuit 22.

Figure 5:
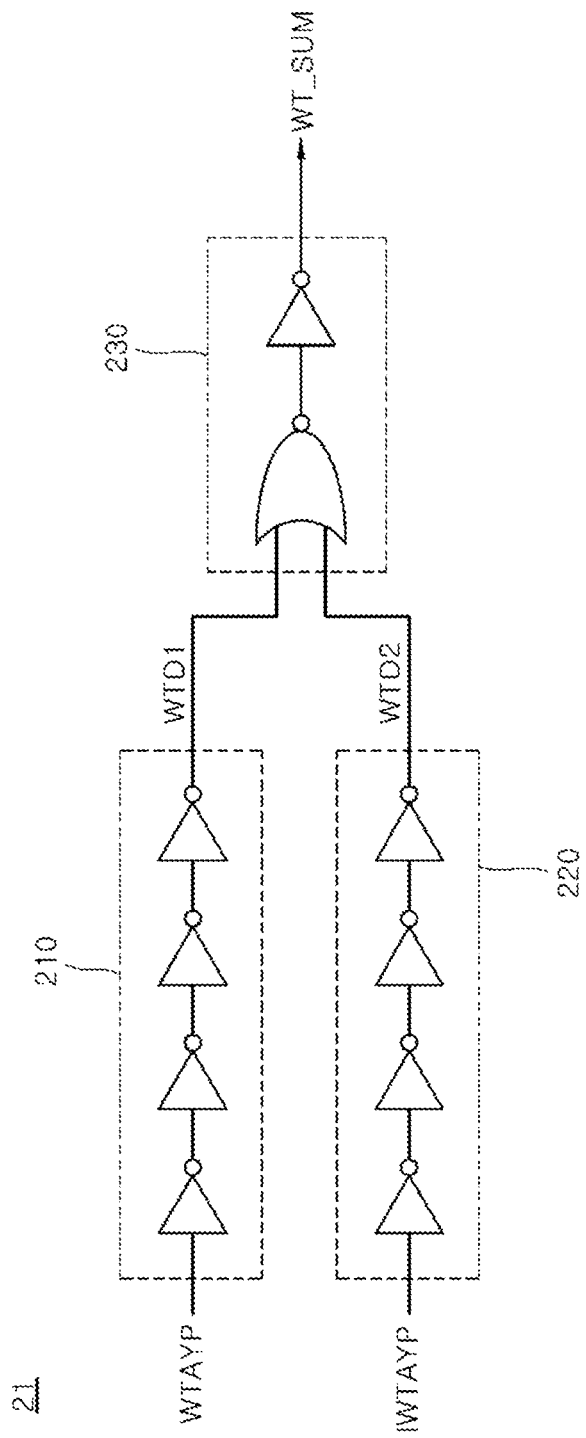
FIG. 5 is a circuit diagram illustrating a configuration of a first synthesis circuit included in the synthesis signal generation circuit of FIG. 4.

Referring to FIG. 5, the first synthesis circuit 21 may include a first delay circuit 210, a second delay circuit 220, and a first logic circuit 230.

The first delay circuit 210 may delay the first write pulse WTAYP by a predetermined delay time to generate a first write delay signal WTD1. The first delay circuit 210 may be realized using an inverter chain comprised of a plurality of inverters that are cascaded. A delay time of the first delay circuit 210 may be set to be different according to the embodiments.

The second delay circuit 220 may delay the second write pulse IWTAYP by a predetermined delay time to generate a second write delay signal WTD2. The second delay circuit 220 may be realized using an inverter chain comprised of a plurality of inverters that are cascaded. A delay time of the second delay circuit 220 may be set to be different according to the embodiments.

The first logic circuit 230 may generate the write synthesis signal WT_SUM which is enabled in response to the first write delay signal WTD1 or the second write delay signal WTD2. The first logic circuit 230 may generate the write synthesis signal WT_SUM which is enabled to have a logic "high" level if any one of the first write delay signal WTD1 and the second write delay signal WTD2 has a logic "high" level. The first logic circuit 230 may perform a logical OR operation of the first write delay signal WTD1 and the second write delay signal WTD2 to generate the write synthesis signal WT_SUM.

Figure 6:
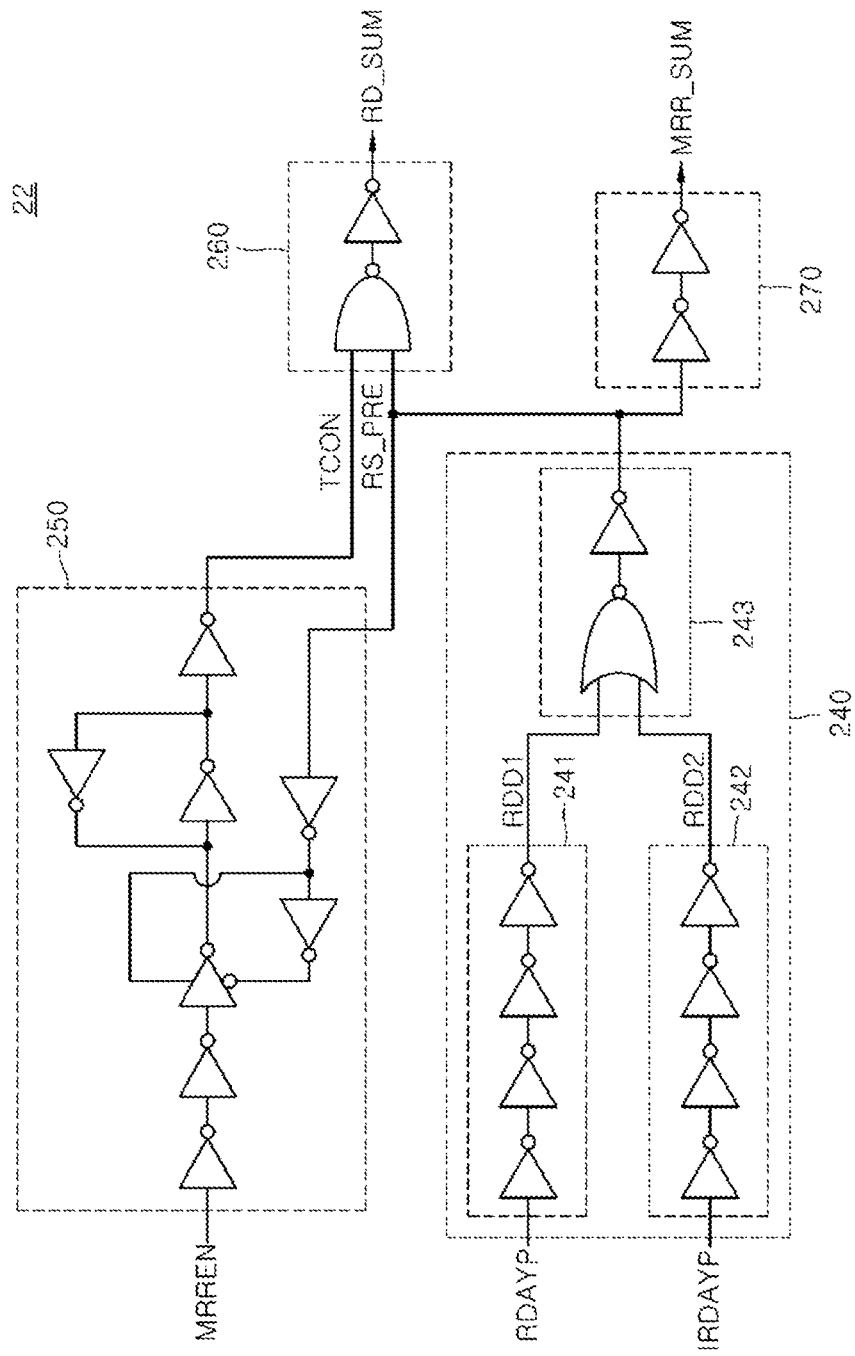
FIG. 6 is a circuit diagram illustrating a configuration of a second synthesis circuit included in the synthesis signal generation circuit of FIG. 4.

Referring to FIG. 6, the second synthesis circuit 22 may include a read synthesis pre-signal generation circuit 240, a transmission control signal generation circuit 250, a signal transmission circuit 260, and a buffer circuit 270.

The read synthesis pre-signal generation circuit 240 may generate a read synthesis pre-signal RS_PRE which is enabled in response to the first read pulse RDAYP or the second read pulse IRDAYP. The read synthesis pre-signal generation circuit 240 may generate the read synthesis pre-signal RS_PRE which is enabled after a predetermined period elapses from a point of time that the first read pulse RDAYP is inputted to the read synthesis pre-signal generation circuit 240. The read synthesis pre-signal generation circuit 240 may generate the read synthesis pre-signal RS_PRE which is enabled after a predetermined period elapses from a point of time that the second read pulse IRDAYP is inputted to the read synthesis pre-signal generation circuit 240. The read synthesis pre-signal generation circuit 240 may perform a logical OR operation of the first read pulse RDAYP and the second read pulse IRDAYP to generate the read synthesis pre-signal RS_PRE.

More specifically, the read synthesis pre-signal generation circuit 240 may include a third delay circuit 241, a fourth delay circuit 242, and a second logic circuit 243.

The third delay circuit 241 may delay the first read pulse RDAYP by a predetermined delay time to generate a first read delayed signal RDD1. The third delay circuit 241 may be realized using an inverter chain comprised of a plurality of inverters that are cascaded. A delay time of the third delay circuit 241 may be set to be different according to the embodiments.

The fourth delay circuit 242 may delay the second read pulse IRDAYP by a predetermined delay time to generate a second read delayed signal RDD2. The fourth delay circuit 242 may be realized using an inverter chain comprised of a plurality of inverters that are cascaded. A delay time of the fourth delay circuit 242 may be set to be different according to the embodiments.

The second logic circuit 243 may generate the read synthesis pre-signal RS_PRE which is enabled in response to the first read delayed signal RDD1 or the second read delayed signal RDD2. The second logic circuit 243 may generate the read synthesis pre-signal RS_PRE which is enabled to have a logic "high" level if any one of the first read delayed signal RDD1 and the second read delayed signal RDD2 has a logic "high" level. The second logic circuit 243 may perform a logical OR operation of the first read delayed signal RDD1 and the second read delayed signal RDD2 to generate the read synthesis pre-signal RS_PRE.

The transmission control signal generation circuit 250 may latch the register enablement signal MRREN in response to the read synthesis pre-signal RS_PRE to output the latched signal of the register enablement signal MRREN as a transmission control signal TCON. The transmission control signal generation circuit 250 may latch the register enablement signal MRREN if the read synthesis pre-signal RS_PRE has a logic "low" level. The transmission control signal generation circuit 250 may inversely buffer the latched signal of the register enablement signal MRREN to output the inversely buffered signal of the latched signal of the register enablement signal MRREN as the transmission control signal TCON.

The signal transmission circuit 260 may output the read synthesis pre-signal RS_PRE as the read synthesis signal RD_SUM or may interrupt the input of the read synthesis pre-signal RS_PRE, in response to the transmission control signal TCON. The signal transmission circuit 260 may output the read synthesis pre-signal RS_PRE as the read synthesis signal RD_SUM if the transmission control signal TCON has a logic "high" level. The signal transmission circuit 260 may interrupt the input of the read synthesis pre-signal RS_PRE if the transmission control signal TCON has a logic "low" level. The signal transmission circuit 260 may perform a logical AND operation of the transmission control signal TCON and the read synthesis pre-signal RS_PRE to generate the read synthesis signal RD_SUM.

The buffer circuit 270 may buffer the read synthesis pre-signal RS_PRE to generate the register synthesis signal MRR_SUM. The buffer circuit 270 may delay the read synthesis pre-signal RS_PRE by a predetermined delay time to generate the register synthesis signal MRR_SUM.

Figure 7:
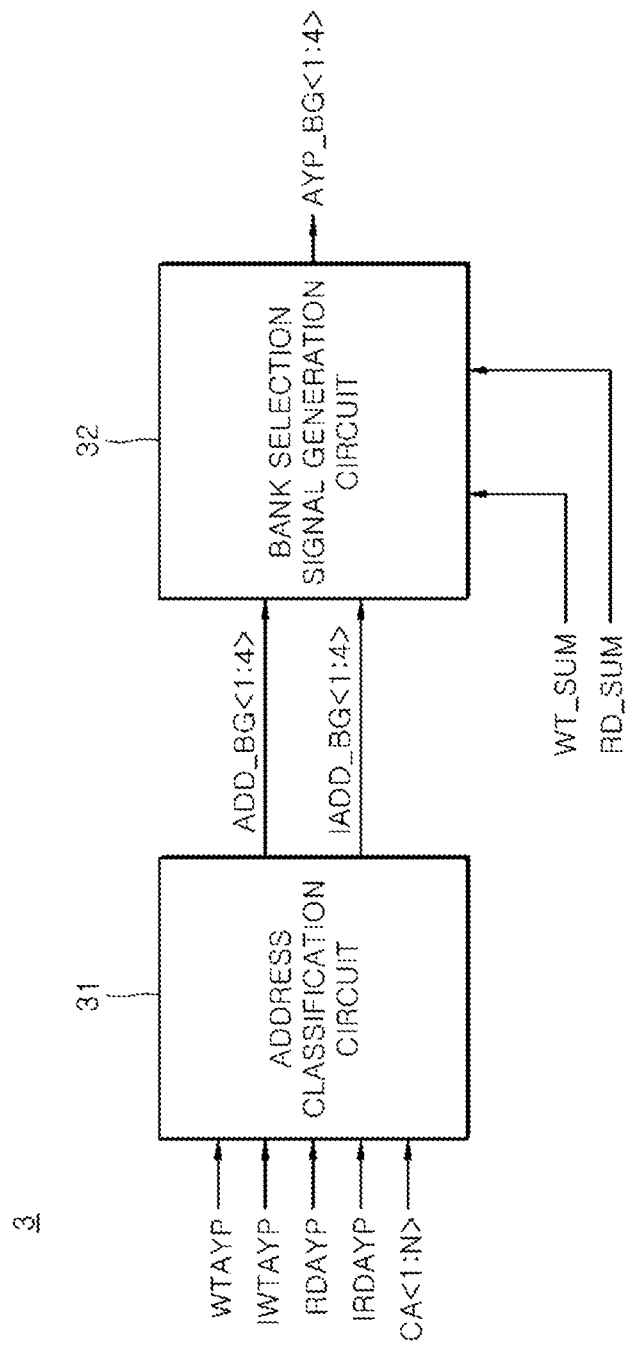
FIG. 7 is a block diagram illustrating a configuration of a column control circuit included in the semiconductor device of FIG. 1.

Referring to FIG. 7, the column control circuit 3 may include an address classification circuit 31 and a bank selection signal generation circuit 32.

The address classification circuit 31 may generate first to fourth bank addresses ADD_BG<1:4> from the command/address signal CA<1:N> in response to the first write pulse WTAYP. The address classification circuit 31 may generate the first to fourth bank addresses ADD_BG<1:4> from the command/address signal CA<1:N> if the first write pulse WTAYP is inputted to the address classification circuit 31. The address classification circuit 31 may generate first to fourth internal bank addresses IADD_BG<1:4> from the command/address signal CA<1:N> in response to the second write pulse IWTAYP. The address classification circuit 31 may generate the first to fourth internal bank addresses IADD_BG<1:4> from the command/address signal CA<1:N> if the second write pulse IWTAYP is inputted to the address classification circuit 31.

The first bank address ADD_BG<1> and the first internal bank address IADD_BG<1> may be generated from the command/address signal CA<1:N> for selecting the first bank group (41 of FIG. 10). The second bank address ADD_BG<2> and the second internal bank address IADD_BG<2> may be generated from the command/address signal CA<1:N> for selecting the second bank group (42 of FIG. 10). The third bank address ADD_BG<3> and the third internal bank address IADD_BG<3> may be generated from the command/address signal CA<1:N> for selecting the third bank group (43 of FIG. 10). The fourth bank address ADD_BG<4> and the fourth internal bank address IADD_BG<4> may be generated from the command/address signal CA<1:N> for selecting the fourth bank group (44 of FIG. 10).

The address classification circuit 31 may generate the first to fourth bank addresses ADD_BG<1:4> from the command/address signal CA<1:N> in response to the first read pulse RDAYP. The address classification circuit 31 may generate the first to fourth bank addresses ADD_BG<1:4> from the command/address signal CA<1:N> if the first read pulse RDAYP is inputted to the address classification circuit 31. The address classification circuit 31 may generate the first to fourth internal bank addresses IADD_BG<1:4> from the command/address signal CA<1:N> in response to the second read pulse IRDAYP. The address classification circuit 31 may generate the first to fourth internal bank addresses IADD_BG<1:4> from the command/address signal CA<1:N> if the second read pulse IRDAYP is inputted to the address classification circuit 31.

The bank selection signal generation circuit 32 may generate the first to fourth bank selection signals AYP_BG<1:4> from the first to fourth bank addresses ADD_BG<1:4> or the first to fourth internal bank addresses IADD_BG<1:4> in response to the write synthesis signal WT_SUM. The bank selection signal generation circuit 32 may generate the first to fourth bank selection signals AYP_BG<1:4> from the first to fourth bank addresses ADD_BG<1:4> or the first to fourth internal bank addresses IADD_BG<1:4> if the write synthesis signal WT_SUM is enabled.

The bank selection signal generation circuit 32 may generate the first to fourth bank selection signals AYP_BG<1:4> from the first to fourth bank addresses ADD_BG<1:4> or the first to fourth internal bank addresses IADD_BG<1:4> in response to the read synthesis signal RD_SUM. The bank selection signal generation circuit 32 may generate the first to fourth bank selection signals AYP_BG<1:4> from the first to fourth bank addresses ADD_BG<1:4> or the first to fourth internal bank addresses IADD_BG<1:4> if the read synthesis signal RD_SUM is enabled.

Figure 8:
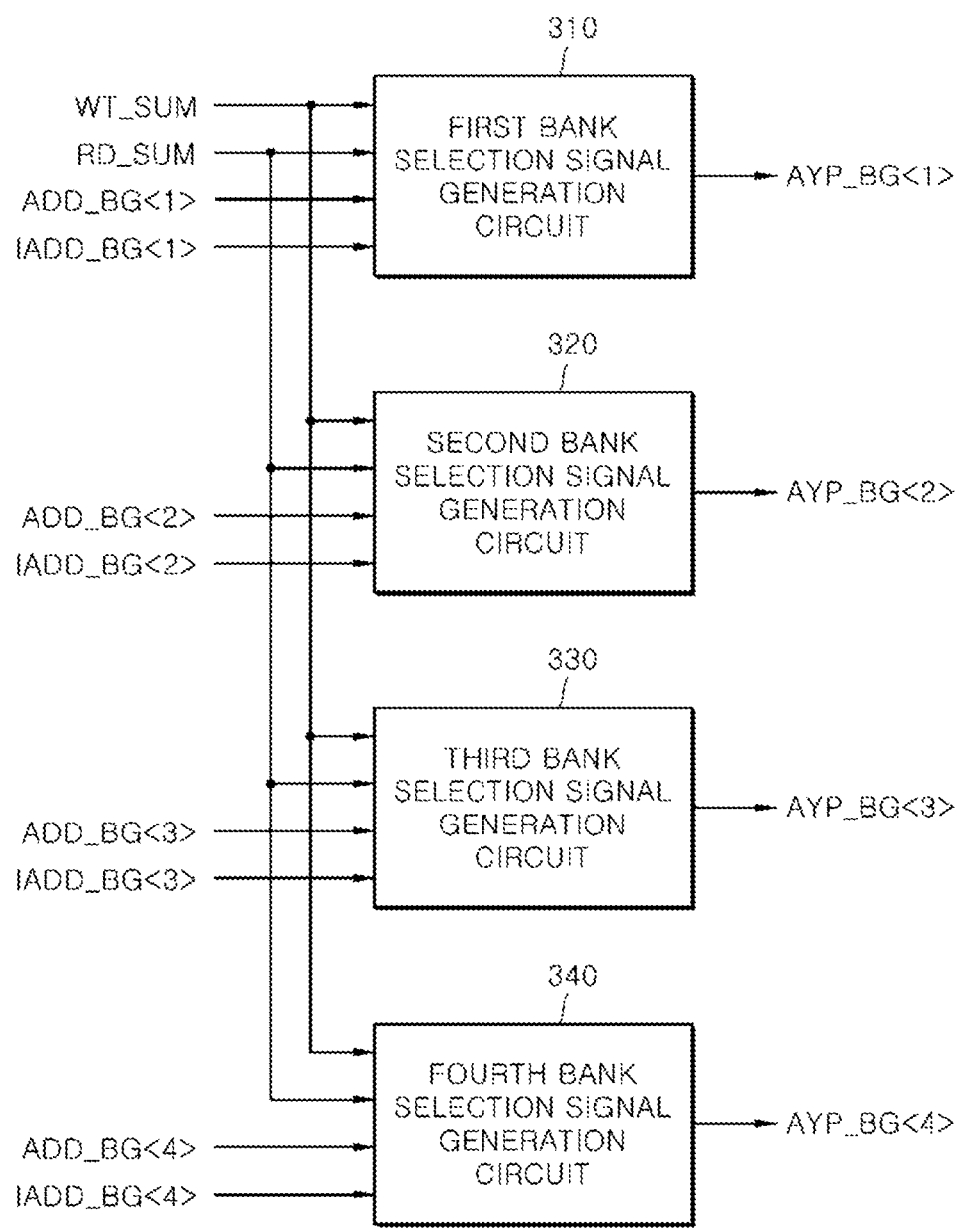
FIG. 8 is a block diagram illustrating a configuration of a bank selection signal generation circuit included in the column control circuit of FIG. 7.

Referring to FIG. 8, the bank selection signal generation circuit 32 may include a first bank selection signal generation circuit 310, a second bank selection signal generation circuit 320, a third bank selection signal generation circuit 330, and a fourth bank selection signal generation circuit 340.

The first bank selection signal generation circuit 310 may generate the first bank selection signal AYP_BG<1> from the first bank address ADD_BG<1> or the first internal bank address IADD_BG<1> in response to the write synthesis signal WT_SUM. The first bank selection signal generation circuit 310 may generate the first bank selection signal AYP_BG<1> from the first bank address ADD_BG<1> or the first internal bank address IADD_BG<1> if the write synthesis signal WT_SUM is enabled. The first bank selection signal generation circuit 310 may generate the first bank selection signal AYP_BG<1> from the first bank address ADD_BG<1> or the first internal bank address IADD_BG<1> in response to the read synthesis signal RD_SUM. The first bank selection signal generation circuit 310 may generate the first bank selection signal AYP_BG<1> from the first bank address ADD_BG<1> or the first internal bank address IADD_BG<1> if the read synthesis signal RD_SUM is enabled.

The second bank selection signal generation circuit 320 may generate the second bank selection signal AYP_BG<2> from the second bank address ADD_BG<2> or the second internal bank address IADD_BG<2> in response to the write synthesis signal WT_SUM. The second bank selection signal generation circuit 320 may generate the second bank selection signal AYP_BG<2> from the second bank address ADD_BG<2> or the second internal bank address IADD_BG<2> if the write synthesis signal WT_SUM is enabled. The second bank selection signal generation circuit 320 may generate the second bank selection signal AYP_BG<2> from the second bank address ADD_BG<2> or the second internal bank address IADD_BG<2> in response to the read synthesis signal RD_SUM. The second bank selection signal generation circuit 320 may generate the second bank selection signal AYP_BG<2> from the second bank address ADD_BG<2> or the second internal bank address IADD_BG<2> if the read synthesis signal RD_SUM is enabled.

The third bank selection signal generation circuit 330 may generate the third bank selection signal AYP_BG<3> from the third bank address ADD_BG<3> or the third internal bank address IADD_BG<3> in response to the write synthesis signal WT_SUM. The third bank selection signal generation circuit 330 may generate the third bank selection signal AYP_BG<3> from the third bank address ADD_BG<3> or the third internal bank address IADD_BG<3> if the write synthesis signal WT_SUM is enabled. The third bank selection signal generation circuit 330 may generate the third bank selection signal AYP_BG<3> from the third bank address ADD_BG<3> or the third internal bank address IADD_BG<3> in response to the read synthesis signal RD_SUM. The third bank selection signal generation circuit 330 may generate the third bank selection signal AYP_BG<3> from the third bank address ADD_BG<3> or the third internal bank address IADD_BG<3> if the read synthesis signal RD_SUM is enabled.

The fourth bank selection signal generation circuit 340 may generate the fourth bank selection signal AYP_BG<4> from the fourth bank address ADD_BG<4> or the fourth internal bank address IADD_BG<4> in response to the write synthesis signal WT_SUM. The fourth bank selection signal generation circuit 340 may generate the fourth bank selection signal AYP_BG<4> from the fourth bank address ADD_BG<4> or the fourth internal bank address IADD_BG<4> if the write synthesis signal WT_SUM is enabled. The fourth bank selection signal generation circuit 340 may generate the fourth bank selection signal AYP_BG<4> from the fourth bank address ADD_BG<4> or the fourth internal bank address IADD_BG<4> in response to the read synthesis signal RD_SUM. The fourth bank selection signal generation circuit 340 may generate the fourth bank selection signal AYP_BG<4> from the fourth bank address ADD_BG<4> or the fourth internal bank address IADD_BG<4> if the read synthesis signal RD_SUM is enabled.

Figure 9:
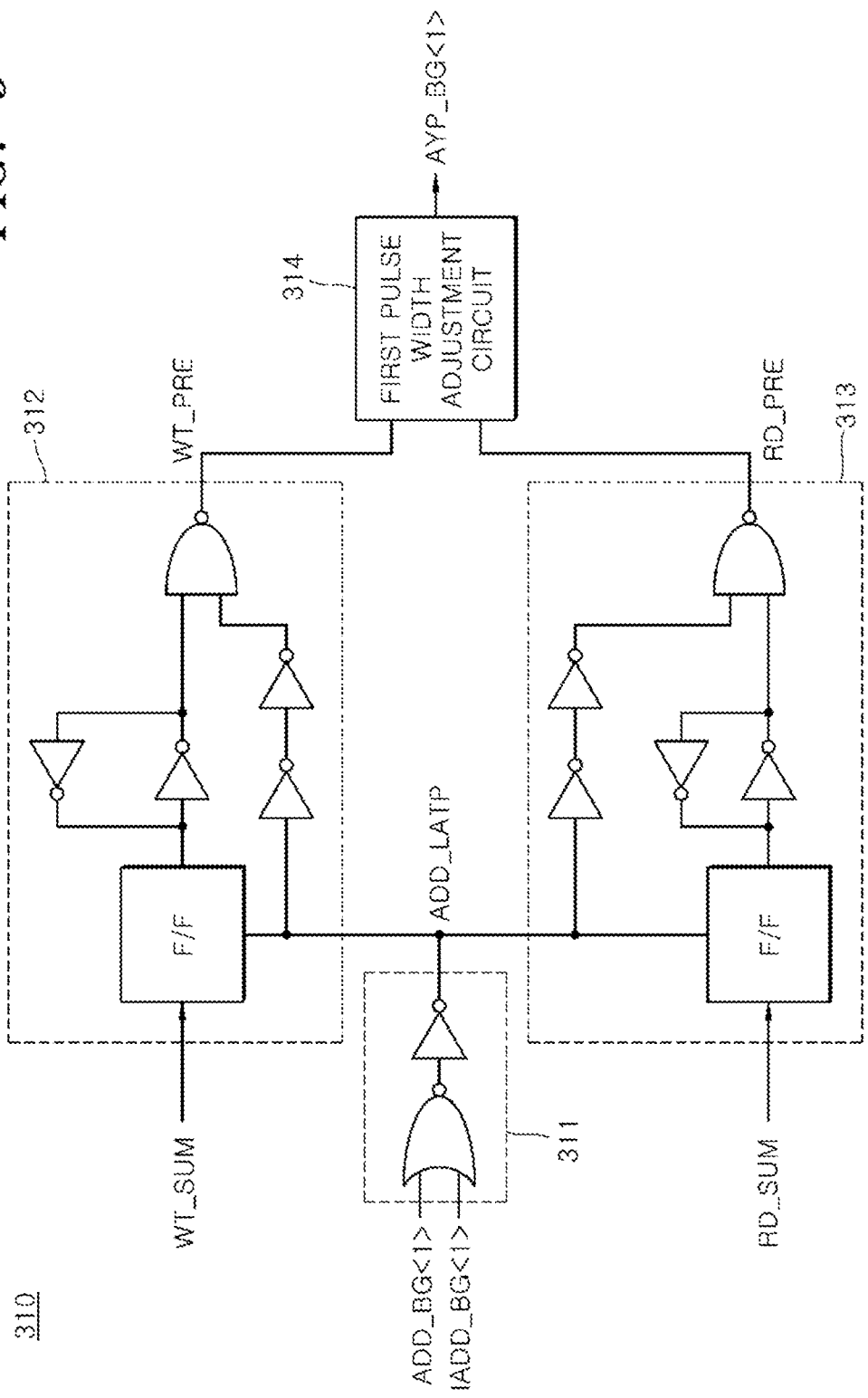
FIG. 9 illustrates a configuration of a first bank selection signal generation circuit included in the bank selection signal generation circuit of FIG. 8.

Referring to FIG. 9, the first bank selection signal generation circuit 310 may include an address latch pulse generation circuit 311, a first latch circuit 312, a second latch circuit 313, and a first pulse width adjustment circuit 314.

The address latch pulse generation circuit 311 may generate an address latch pulse ADD_LATP which is enabled in response to any one of the first bank address ADD_BG<1> and the first internal bank address IADD_BG<1>. The address latch pulse generation circuit 311 may perform a logical OR operation of the first bank address ADD_BG<1> and the first internal bank address IADD_BG<1> to generate the address latch pulse ADD_LATP. The address latch pulse generation circuit 311 may generate the address latch pulse ADD_LATP which is enabled to have a logic "high" level if any one of the first bank address ADD_BG<1> and the first internal bank address IADD_BG<1> has a logic "high" level.

The first latch circuit 312 may latch the write synthesis signal WT_SUM in response to the address latch pulse ADD_LATP to generate a write pre-signal WT_PRE. The first latch circuit 312 may latch the write synthesis signal WT_SUM if the address latch pulse ADD_LATP has a logic "high" level. The first latch circuit 312 may output the latched signal of the write synthesis signal WT_SUM as the write pre-signal WT_PRE if the address latch pulse ADD_LATP has a logic "high" level. In an embodiment, the first latch circuit 312 may include a flip-flop F/F element.

The second latch circuit 313 may latch the read synthesis signal RD_SUM in response to the address latch pulse ADD_LATP to generate a read pre-signal RD_PRE. The second latch circuit 313 may latch the read synthesis signal RD_SUM if the address latch pulse ADD_LATP has a logic "high" level. The second latch circuit 313 may output the latched signal of the read synthesis signal RD_SUM as the read pre-signal RD_PRE if the address latch pulse ADD_LATP has a logic "high" level. In an embodiment, the second latch circuit 313 may include a flip-flop F/F element.

The first pulse width adjustment circuit 314 may adjust a pulse width of the write pre-signal WT_PRE or the read pre-signal RD_PRE to generate the first bank selection signal AYP_BG<1> having a first pulse width. The first pulse width adjustment circuit 314 may adjust a pulse width of the write pre-signal WT_PRE to generate the first bank selection signal AYP_BG<1> having the first pulse width. The first pulse width adjustment circuit 314 may adjust a pulse width of the read pre-signal RD_PRE to generate the first bank selection signal AYP_BG<1> having the first pulse width. The first pulse width may be set according to a length of the first memory input/output (I/O) line MIO<1> that transmits the first bank selection signal AYP_BG<1>. Thus, if the first memory input/output (I/O) line MIO<1> is realized to be relatively long, the first pulse width may be set to be relatively wide. For example, the first pulse width may be set to be approximately 2.5 nanoseconds.

Meanwhile, each of the second to fourth bank selection signal generation circuits 320, 330, and 340 illustrated in FIG. 8 may be realized to have substantially the same configuration as the first bank selection signal generation circuit 310 illustrated in FIG. 9 except input/output signals thereof. That is, each of the second to fourth bank selection signal generation circuits 320, 330, and 340 may perform substantially the same operation as the first bank selection signal generation circuit 310. Thus, detailed descriptions of the second to fourth bank selection signal generation circuits 320, 330, and 340 will be omitted hereinafter.

Referring to FIG. 10, the core circuit 4 may include the first bank group 41, the second bank group 42, the third bank group 43, and the fourth bank group 44.

The first bank group 41 may be realized to include a plurality of banks to perform the column operation for receiving or outputting data (not illustrated). The first bank group 41 may be activated in response to the first bank selection signal AYP_BG<1> to perform the column operation for receiving or outputting the data (not illustrated). The first bank group 41 may be activated to perform the column operation for receiving or outputting the data (not illustrated) if the first bank selection signal AYP_BG<1> is enabled to have a logic "high" level.

The second bank group 42 may be realized to include a plurality of banks to perform the column operation for receiving or outputting data (not illustrated). The second bank group 42 may be activated in response to the second bank selection signal AYP_BG<2> to perform the column operation for receiving or outputting the data (not illustrated). The second bank group 42 may be activated to perform the column operation for receiving or outputting the data (not illustrated) if the second bank selection signal AYP_BG<2> is enabled to have a logic "high" level.

The third bank group 43 may be realized to include a plurality of banks to perform the column operation for receiving or outputting data (not illustrated). The third bank group 43 may be activated in response to the third bank selection signal AYP_BG<3> to perform the column operation for receiving or outputting the data (not illustrated). The third bank group 43 may be activated to perform the column operation for receiving or outputting the data (not illustrated) if the third bank selection signal AYP_BG<3> is enabled to have a logic "high" level.

The fourth bank group 44 may be realized to include a plurality of banks to perform the column operation for receiving or outputting data (not illustrated). The fourth bank group 44 may be activated in response to the fourth bank selection signal AYP_BG<4> to perform the column operation for receiving or outputting the data (not illustrated). The fourth bank group 44 may be activated to perform the column operation for receiving or outputting the data (not illustrated) if the fourth bank selection signal AYP_BG<4> is enabled to have a logic "high" level.

Figure 11:
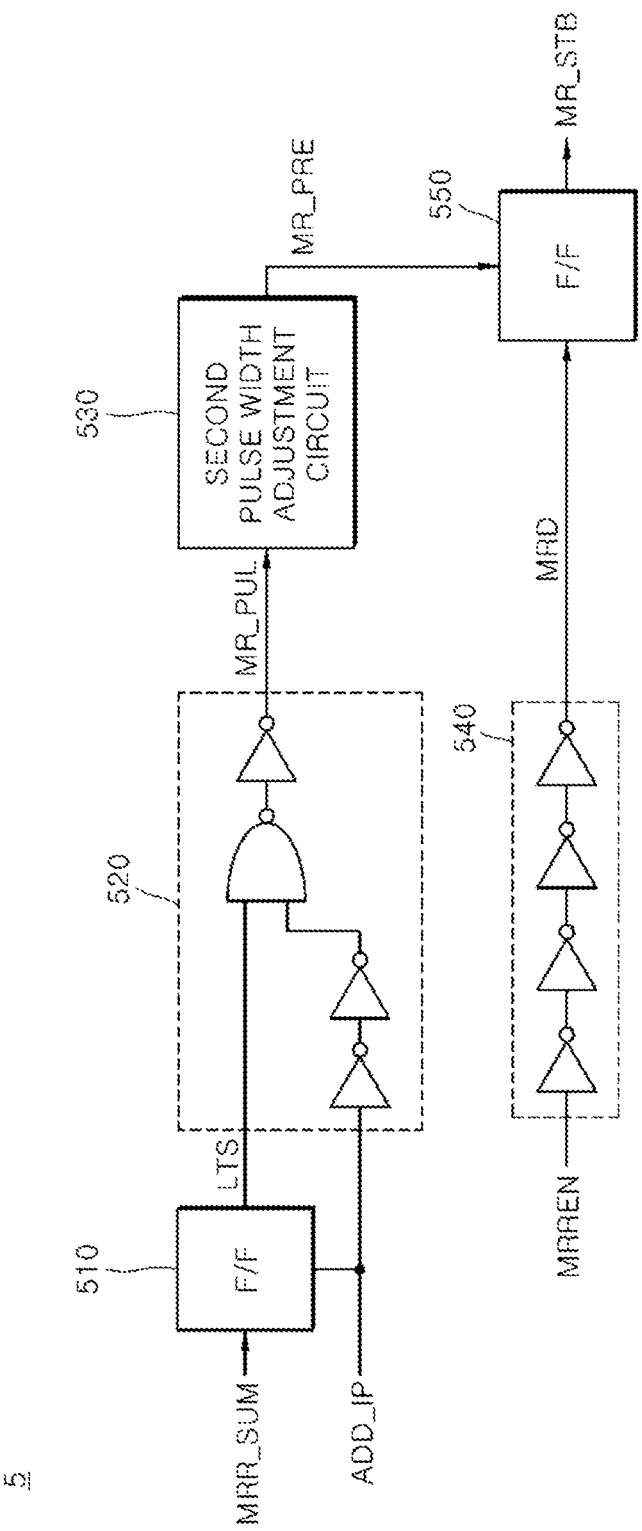
FIG. 11 illustrates a configuration of a control signal generation circuit included in the semiconductor device of FIG. 1.

Referring to FIG. 11, the control signal generation circuit 5 may include a third latch circuit 510, a register pulse signal generation circuit 520, a second pulse width adjustment circuit 530, a fifth delay circuit 540, and a fourth latch circuit 550.

The third latch circuit 510 may latch the register synthesis signal MRR_SUM in response to an address input pulse ADD_IP to generate a latch signal LTS. The third latch circuit 510 may latch the register synthesis signal MRR_SUM if the address input pulse ADD_IP is enabled to have a logic "high" level. The third latch circuit 510 may output the latched signal of the register synthesis signal MRR_SUM as the latch signal LTS if the address input pulse ADD_IP is enabled to have a logic "high" level. The address input pulse ADD_IP may be set to include a pulse having a logic "high" level during a predetermined period while the write operation, the read operation, or the mode register read operation is performed. In an embodiment, the third latch circuit 510 may include a flip-flop F/F element.

The register pulse signal generation circuit 520 may generate a register pulse signal MR_PUL including a pulse which is created during a predetermined period in response to the latch signal LTS and the address input pulse ADD_IP. The register pulse signal generation circuit 520 may generate the register pulse signal MR_PUL including a pulse having a logic "high" level if the latch signal LTS has a logic "high" level and the address input pulse ADD_IP has a logic "high" level. The register pulse signal generation circuit 520 may perform a logical AND operation of the latch signal LTS and the address input pulse ADD_IP to generate the register pulse signal MR_PUL.

The second pulse width adjustment circuit 530 may adjust a pulse width of the register pulse signal MR_PUL to generate a register pre-signal MR_PRE having a second pulse width. The second pulse width may be set according to a length of the register I/O line RIO that transmits the control signal MR_STB, and the register I/O line RIO may be realized to have a length which is less than a length of each of the first to fourth memory I/O lines MIO<1:4>. Thus, the second pulse width may be set to be less than the first pulse width. For example, the second pulse width may be set to be approximately 1.5 nanoseconds. For example, in an embodiment, each of the first and second bank selection signals AYP_BG<1:2> may include a pulse having a first pulse width set to be greater than the second pulse width of a pulse included in the control signal MR_STB.

The fifth delay circuit 540 may delay the register enablement signal MRREN by a predetermined delay time to generate a register delay signal MRD. The fifth delay circuit 540 may be realized using an inverter chain comprised of a plurality of inverters that are cascaded. A delay time of the fifth delay circuit 540 may be set to be different according to the embodiments.

The fourth latch circuit 550 may latch the register delay signal MRD in response to the register pre-signal MR_PRE to generate the control signal MR_STB. The fourth latch circuit 550 may latch the register delay signal MRD in response to the register pre-signal MR_PRE and may adjust a pulse width of the latched signal of the register delay signal MRD to generate the control signal MR_STB including a pulse that has the same pulse width as a pulse of the register pre-signal MR_PRE. For example, the fourth latch circuit 550 may output the register delay signal MRD as the control signal MR_STB during a period that a pulse of the register pre-signal MR_PRE is created. In an embodiment, the fourth latch circuit 550 may include a flip-flop F/F element.

Figure 12:
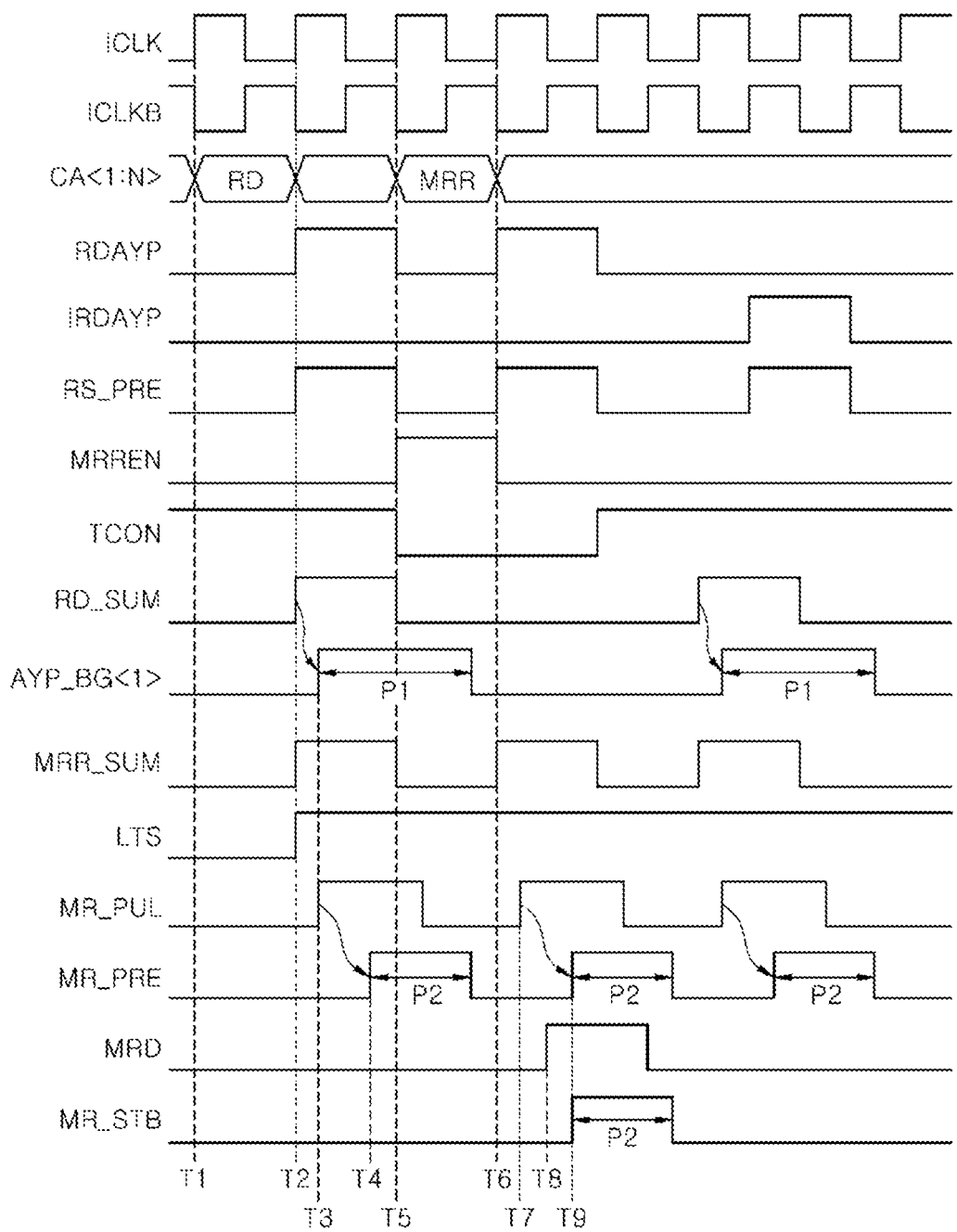
FIG. 12 is a timing diagram illustrating an operation of a semiconductor device according to an embodiment of the present disclosure.

The mode register read operation in the read operation of the semiconductor device according to an embodiment will be described hereinafter with reference to FIG. 12 in conjunction with an example in which signals are transmitted through paths having different lengths that are set by adjusting pulse widths of the bank selection signals and the control signal.

At a point of time "T1", the command/address signal CA<1:N> having a logic level combination for performing the read operation may be inputted to the command decoder 11 of the semiconductor device.

The command decoder 11 may decode the command/address signal CA<1:N> in synchronization with the internal clock signal ICLK and the inverted internal clock signal ICLKB to generate the read signal RD.

At a point of time "T2", the pulse generation circuit 12 may generate the first read pulse RDAYP in response to the read signal RD.

The read synthesis pre-signal generation circuit 240 may generate the read synthesis pre-signal RS_PRE which is enabled to have a logic "high" level since the first read pulse RDAYP has a logic "high" level. In such a case, the transmission control signal generation circuit 250 may generate the transmission control signal TCON having a logic "high" level since the register enablement signal MRREN has a logic "low" level.

The signal transmission circuit 260 may output the read synthesis pre-signal RS_PRE as the read synthesis signal RD_SUM in response to the transmission control signal TCON having a logic "high" level.

The buffer circuit 270 may buffer the read synthesis pre-signal RS_PRE to generate the register synthesis signal MRR_SUM having a logic "high" level.

The address classification circuit 31 may generate any one of the first to fourth bank addresses ADD_BG<1:4> from the command/address signal CA<1:N> in response to the first read pulse RDAYP. For example, the address classification circuit 31 may generate the first bank address ADD_BG<1> having a logic "high" level from the command/address signal CA<1:N> in response to the first read pulse RDAYP.

The third latch circuit 510 of the control signal generation circuit 5 may latch the register synthesis signal MRR_SUM in response to the address input pulse ADD_IP to generate the latch signal LTS.

At a point of time "T3", the register pulse signal generation circuit 520 may generate the register pulse signal MR_PUL including a pulse which is created during a predetermined period in response to the latch signal LTS having a logic "high" level and the address input pulse ADD_IP having a logic "high" level.

The first bank selection signal generation circuit 310 of the bank selection signal generation circuit 32 may generate the first bank selection signal AYP_BG<1> from the first bank address ADD_BG<1> in response to the read synthesis signal RD_SUM which is generated at the point of time "T2". In such a case, the first bank selection signal AYP_BG<1> may be adjusted to have a first pulse width P1, and the first bank selection signal AYP_BG<1> having the first pulse width P1 may be transmitted to the core circuit 4 through the first memory I/O line MIO<1>.

The first bank group 41 of the core circuit 4 may be activated in response to the first bank selection signal AYP_BG<1> having a logic "high" level to perform the read operation outputting data (not illustrated) stored in the first bank group 41.

At a point of time "T4", the second pulse width adjustment circuit 530 may adjust a pulse width of the register pulse signal MR_PUL to generate the register pre-signal MR_PRE having a second pulse width P2.

The fifth delay circuit 540 may delay the register enablement signal MRREN by a predetermined delay time to generate the register delay signal MRD having a logic "low" level.

The fourth latch circuit 550 may latch the register delay signal MRD in response to the register pre-signal MR_PRE having a logic "high" level to generate the control signal MR_STB having a logic "low" level.

At a point of time "T5", the command/address signal CA<1:N> having a logic level combination for performing the mode register read operation may be inputted to the command decoder 11 of the semiconductor device.

The command decoder 11 may decode the command/address signal CA<1:N> in synchronization with the internal clock signal ICLK and the inverted internal clock signal ICLKB to generate the mode register read signal MRR.

The pulse generation circuit 12 may generate the register enablement signal MRREN in response to the mode register read signal MRR.

The read synthesis pre-signal generation circuit 240 of the second synthesis circuit 22 may generate the read synthesis pre-signal RS_PRE which is disabled to have a logic "low" level in response to the first read pulse RDAYP having a logic "low" level and the second read pulse IRDAYP having a logic "low" level.

The transmission control signal generation circuit 250 may latch the register enablement signal MRREN in response to the read synthesis pre-signal RS_PRE having a logic "low" level and may inversely buffer the latched signal of the register enablement signal MRREN to generate the transmission control signal TCON having a logic "low" level.

The signal transmission circuit 260 may interrupt the input of the read synthesis pre-signal RS_PRE to generate the read synthesis signal RD_SUM having a logic "low" level since the transmission control signal TCON has a logic "low" level.

At a point of time "T6", the pulse generation circuit 12 may generate the first read pulse RDAYP in response to the read signal RD generated at the point of time "Ti".

The read synthesis pre-signal generation circuit 240 of the second synthesis circuit 22 may generate the read synthesis pre-signal RS_PRE which is enabled to have a logic "high" level since the first read pulse RDAYP has a logic "high" level. In such a case, the transmission control signal generation circuit 250 may generate the transmission control signal TCON having a logic "low" level since the read synthesis pre-signal RS_PRE has a logic "high" level.

The signal transmission circuit 260 may interrupt the input of the read synthesis pre-signal RS_PRE in response to the transmission control signal TCON having a logic "low" level to generate the read synthesis signal RD_SUM having a logic "low" level.

The buffer circuit 270 may buffer the read synthesis pre-signal RS_PRE to generate the register synthesis signal MRR_SUM having a logic "high" level.

The third latch circuit 510 of the control signal generation circuit 5 may latch the register synthesis signal MRR_SUM in response to the address input pulse ADD_IP to generate the latch signal LTS having a logic "high" level.

At a point of time "T7", the register pulse signal generation circuit 520 may generate the register pulse signal MR_PUL including a pulse which is created during a predetermined period in response to the latch signal LTS having a logic "high" level and the address input pulse ADD_IP having a logic "high" level.

At a point of time "T8", the fifth delay circuit 540 may delay the register enablement signal MRREN by a predetermined delay time to generate the register delay signal MRD having a logic "high" level.

At a point of time "T9", the second pulse width adjustment circuit 530 may adjust a pulse width of the register pulse signal MR_PUL to generate the register pre-signal MR_PRE having the second pulse width P2.

The fourth latch circuit 550 may latch the register delay signal MRD having a logic "high" level in response to the register pre-signal MR_PRE having a logic "high" level to generate the control signal MR_STB having a logic "high"

level and the second pulse width P2. The control signal MR_STB may be transmitted to the mode register 6 through the register I/O line RIO.

The mode register 6 may perform the mode register read operation in response to the control signal MR_STB having a logic "high" level.

As described above, a semiconductor device according to an embodiment may generate bank selection signals for performing a column operation and a control signal for performing a mode register read operation to efficiently perform the column operation and the mode register read operation for bank groups included in the semiconductor device. In addition, the semiconductor device may adjust pulse widths of the bank selection signals and the control signal to match the pulse widths of the bank selection signals and the control signal with paths of the bank selection signals and the control signal. As a result, power consumption of the semiconductor device may be reduced.

Figure 13:
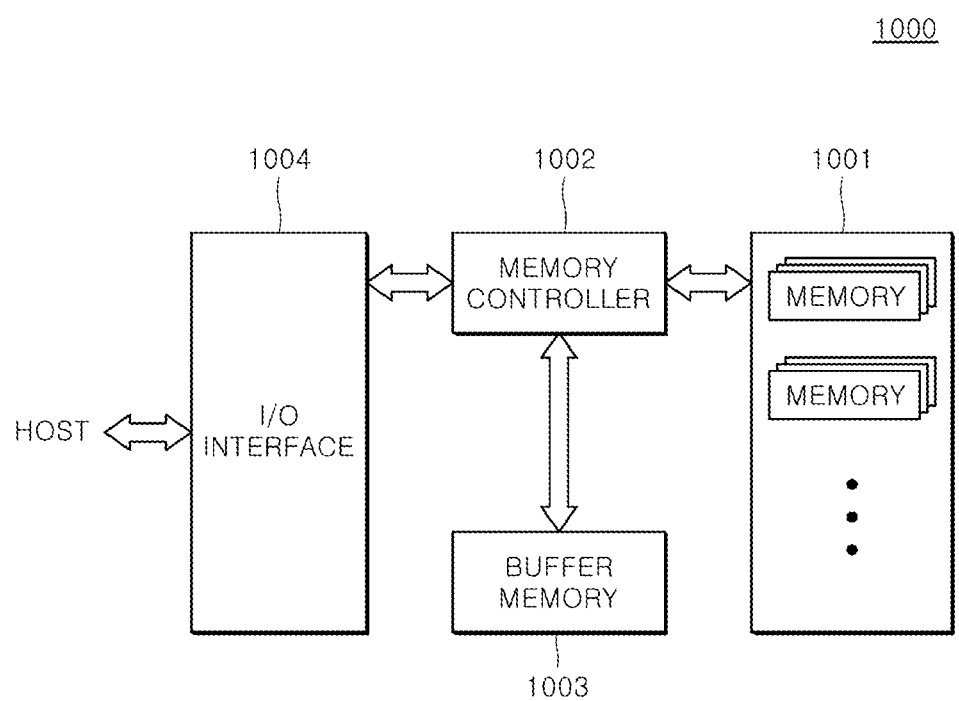
FIG. 13 is a block diagram illustrating a configuration of an electronic system employing the semiconductor device shown in FIGS. 1 to 12.

The semiconductor device described with reference to FIGS. 1 to 12 may be applied to an electronic system that includes a memory system, a graphic system, a computing system, a mobile system, or the like. For example, as illustrated in FIG. 13, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include the semiconductor device illustrated in FIG. 1. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 13 illustrates the memory controller 1002 with a single block, the memory controller 1002 may include one controller for controlling the data storage circuit 1001 and another controller for controlling the buffer memory 1003 comprised of a volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data outputted from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), an integrated drive electronics (IDE), etc.

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
   a synthesis signal generation circuit configured to generate a register synthesis signal in response to a first read pulse and a second read pulse which are sequentially generated during a read operation;
   a column control circuit configured to generate any one of a first bank selection signal and a second bank selection signal for respectively selecting a first bank group and a second bank group of a core circuit in response to the first read pulse and the second read pulse; and
   a control signal generation circuit configured to generate a control signal for controlling an output operation of a mode register in response to the register synthesis signal.

2. The semiconductor device of claim 1,
   wherein the first and second bank selection signals are transmitted through a first memory input/output (I/O) line and a second memory I/O line, respectively;
   wherein the control signal is transmitted through a register I/O line; and
   wherein a length of the first and second memory I/O lines is greater than a length of the register I/O line.

3. The semiconductor device of claim 1,
   wherein each of the first and second bank selection signals includes a pulse having a first pulse width;
   wherein the control signal includes a pulse having a second pulse width; and
   wherein the first pulse width is set to be greater than the second pulse width.

4. The semiconductor device of claim 1, wherein the synthesis signal generation circuit generates a read synthesis signal in response to the first read pulse and the second read pulse which are sequentially generated during the read operation and interrupts generation of the read synthesis signal in response to a register enablement signal generated during a mode register read operation.

5. The semiconductor device of claim 4, wherein the column control circuit is configured to generate any one of the first bank selection signal and the second bank selection signal for respectively selecting the first bank group and the second bank group of the core circuit in response to the first read pulse, the second read pulse, and the read synthesis signal.

6. The semiconductor device of claim 4, wherein the synthesis signal generation circuit includes:
a read synthesis pre-signal generation circuit configured to generate a read synthesis pre-signal which is enabled in response to any one of the first read pulse and the second read pulse;
a transmission control signal generation circuit configured to latch the register enablement signal in response to the read synthesis pre-signal to output the latched signal of the register enablement signal as a transmission control signal;
a signal transmission circuit configured to output the read synthesis pre-signal as the read synthesis signal in response to the transmission control signal or configured to interrupt input of the read synthesis pre-signal in response to the transmission control signal; and
a buffer circuit configured to buffer the read synthesis pre-signal to output the buffered signal of the read synthesis pre-signal as the register synthesis signal.

7. The semiconductor device of claim 6, wherein the read synthesis pre-signal generation circuit includes:
a first delay circuit configured to delay the first read pulse to generate a first read delayed signal;
a second delay circuit configured to delay the second read pulse to generate a second read delayed signal; and
a first logic circuit configured to generate the read synthesis pre-signal which is enabled in response to any one of the first read delayed signal and the second read delayed signal.

8. The semiconductor device of claim 4, wherein the column control circuit includes:
an address classification circuit configured to generate a first bank address and a second bank address from a command/address signal in response to the first read pulse and configured to generate a first internal bank address and a second internal bank address from the command/address signal in response to the second read pulse; and
a bank selection signal generation circuit configured to generate the first bank selection signal from the first bank address or the first internal bank address in response to the read synthesis signal and configured to generate the second bank selection signal from the second bank address or the second internal bank address in response to the read synthesis signal.

9. The semiconductor device of claim 8, wherein the bank selection signal generation circuit includes:
a first bank selection signal generation circuit configured to latch the read synthesis signal to generate the first bank selection signal at a point of time that the first bank address or the first internal bank address is generated; and
a second bank selection signal generation circuit configured to latch the read synthesis signal to generate the second bank selection signal at a point of time that the second bank address or the second internal bank address is generated.

10. The semiconductor device of claim 9, wherein the first bank selection signal generation circuit includes:
an address latch pulse generation circuit configured to generate an address latch pulse which is enabled in response to any one of the first bank address and the first internal bank address;
a latch circuit configured to latch the read synthesis signal in response to the address latch pulse to generate a read pre-signal; and
a first pulse width adjustment circuit configured to adjust a pulse width of the read pre-signal to generate the first bank selection signal having a first pulse width.

11. The semiconductor device of claim 9, wherein the second bank selection signal generation circuit includes:
an address latch pulse generation circuit configured to generate an address latch pulse which is enabled in response to any one of the second bank address and the second internal bank address;
a latch circuit configured to latch the read synthesis signal in response to the address latch pulse to generate a read pre-signal; and
a first pulse width adjustment circuit configured to adjust a pulse width of the read pre-signal to generate the second bank selection signal having a first pulse width.

12. The semiconductor device of claim 4, wherein the control signal generation circuit includes:
a first latch circuit configured to latch the register synthesis signal in response to an address input pulse to generate a latch signal;
a register pulse signal generation circuit configured to generate a register pulse signal including a pulse which is created during a predetermined period in response to the latch signal and the address input pulse;
a second pulse width adjustment circuit configured to adjust a pulse width of the register pulse signal to generate a register pre-signal having a second pulse width;
a delay circuit configured to delay the register enablement signal to generate a register delay signal; and
a second latch circuit configured to output the register delay signal as the control signal during a period that a pulse of the register pre-signal is created.

13. The semiconductor device of claim 4, further comprising an operation pulse generation circuit configured to be synchronized with an internal clock signal and an inverted internal clock signal to generate the first read pulse and the second read pulse which are sequentially enabled when a command/address signal has a logic level combination for performing the read operation and configured to be synchronized with the internal clock signal and the inverted internal clock signal to generate the register enablement signal which is enabled when the command/address signal has a logic level combination for performing the mode register read operation.

14. The semiconductor device of claim 13, wherein the operation pulse generation circuit includes:
a command decoder configured to be synchronized with the internal clock signal and the inverted internal clock signal to generate a read signal which is enabled when the command/address signal has a logic level combination for performing the read operation and configured to be synchronized with the internal clock signal and the inverted internal clock signal to generate a mode register read signal which is enabled when the command/address signal has a logic level combination for performing the mode register read operation; and
a pulse generation circuit configured to generate the first read pulse and the second read pulse which are sequentially enabled in response to the read signal and configured to generate the register enablement signal which is enabled in response to the mode register read signal.

15. The semiconductor device of claim 14, wherein the pulse generation circuit includes:
   a first pulse generation circuit configured to generate the first read pulse including a pulse which is created after a predetermined period elapses from a point of time that the read signal is enabled;
   a second pulse generation circuit configured to generate the second read pulse including a pulse which is created after a predetermined period elapses from a point of time that the first read pulse is created; and
   a third pulse generation circuit configured to generate the register enablement signal including a pulse which is created after a predetermined period elapses from a point of time that the mode register read signal is enabled.

16. A semiconductor device comprising:
   a synthesis signal generation circuit configured to generate a register synthesis signal in response to a read pulse;
   a column control circuit configured to generate any one of a first bank selection signal and a second bank selection signal for respectively selecting a first bank group and a second bank group of a core circuit in response to a write pulse or the read pulse; and
   a control signal generation circuit configured to generate a control signal for controlling an output operation of a mode register in response to the register synthesis signal.

17. The semiconductor device of claim 16, wherein the synthesis signal generation circuit generates a write synthesis signal in response to the write pulse, generates a read synthesis signal in response to the read pulse, and interrupts generation of the read synthesis signal in response to a register enablement signal.

18. The semiconductor device of claim 17, wherein the column control circuit is configured to generate any one of the first bank selection signal and the second bank selection signal for respectively selecting the first bank group and the second bank group of the core circuit in response to the write pulse and the write synthesis signal or in response to the read pulse and the read synthesis signal.

19. The semiconductor device of claim 17,
   wherein the write pulse includes a pulse for performing a write operation;
   wherein the read pulse includes a pulse for performing a read operation; and
   wherein the register enablement signal includes a pulse for performing a mode register read operation.

20. The semiconductor device of claim 16,
   wherein the first and second bank selection signals are transmitted through a first memory input/output (I/O) line and a second memory I/O line, respectively;
   wherein the control signal is transmitted through a register I/O line; and
   wherein a length of the first and second memory I/O lines is greater than a length of the register I/O line.

21. The semiconductor device of claim 16,
   wherein each of the first and second bank selection signals includes a pulse having a first pulse width;
   wherein the control signal includes a pulse having a second pulse width; and
   wherein the first pulse width is set to be greater than the second pulse width.

22. The semiconductor device of claim 17, wherein the synthesis signal generation circuit includes:
   a first synthesis circuit configured to generate the write synthesis signal which is enabled after a predetermined period elapses from a point of time that the write pulse is inputted to the first synthesis circuit; and
   a second synthesis circuit configured to generate the read synthesis signal which is enabled after a predetermined period elapses from a point of time that the read pulse is inputted to the second synthesis circuit, configured to interrupt generation of the read synthesis signal in response to the register enablement signal, and configured to generate the register synthesis signal which is enabled after a predetermined period elapses from a point of time that the read pulse is inputted to the second synthesis circuit.

23. The semiconductor device of claim 22, wherein the second synthesis circuit includes:
   a read synthesis pre-signal generation circuit configured to generate a read synthesis pre-signal which is enabled in response to the read pulse;
   a transmission control signal generation circuit configured to latch the register enablement signal in response to the read synthesis pre-signal and configured to output the latched signal of the register enablement signal as a transmission control signal in response to the read synthesis pre-signal;
   a signal transmission circuit configured to output the read synthesis pre-signal as the read synthesis signal in response to the transmission control signal or configured to interrupt input of the read synthesis pre-signal in response to the transmission control signal; and
   a buffer circuit configured to buffer the read synthesis pre-signal to output the buffered signal of the read synthesis pre-signal as the register synthesis signal.

24. The semiconductor device of claim 17, wherein the column control circuit includes:
   an address classification circuit configured to generate a first bank address and a second bank address from a command/address signal in response to the write pulse or the read pulse; and
   a bank selection signal generation circuit configured to generate the first bank selection signal from the first bank address in response to the write synthesis signal or the read synthesis signal and configured to generate the second bank selection signal from the second bank address in response to the write synthesis signal or the read synthesis signal.

25. The semiconductor device of claim 24, wherein the bank selection signal generation circuit includes:
   a first bank selection signal generation circuit configured to latch the read synthesis signal or the write synthesis signal to generate the first bank selection signal at a point of time that the first bank address is generated; and
   a second bank selection signal generation circuit configured to latch the read synthesis signal or the write synthesis signal to generate the second bank selection signal at a point of time that the second bank address is generated.

26. The semiconductor device of claim 25, wherein the first bank selection signal generation circuit includes:
   a first latch circuit configured to latch the write synthesis signal to generate a write pre-signal, in response to an address latch pulse which is enabled when the first bank address is inputted to the first latch circuit;
   a second latch circuit configured to latch the read synthesis signal in response to the address latch pulse to generate a read pre-signal; and a first pulse width adjustment circuit configured to adjust a pulse width of the read pre-signal or the write pre-signal to generate the first bank selection signal having a first pulse width.

27. The semiconductor device of claim 25, wherein the second bank selection signal generation circuit includes:
a first latch circuit configured to latch the write synthesis signal to generate a write pre-signal, in response to an address latch pulse which is enabled when the second bank address is inputted to the first latch circuit;
a second latch circuit configured to latch the read synthesis signal in response to the address latch pulse to generate a read pre-signal; and
a first pulse width adjustment circuit configured to adjust a pulse width of the read pre-signal or the write pre-signal to generate the second bank selection signal having a first pulse width.

28. The semiconductor device of claim 17, wherein the control signal generation circuit includes:
a first latch circuit configured to latch the register synthesis signal in response to an address input pulse to generate a latch signal;
a register pulse signal generation circuit configured to generate a register pulse signal including a pulse which is created during a predetermined period in response to the latch signal and the address input pulse;
a second pulse width adjustment circuit configured to adjust a pulse width of the register pulse signal to generate a register pre-signal having a second pulse width;
a delay circuit configured to delay the register enablement signal to generate a register delay signal; and
a second latch circuit configured to output the register delay signal as the control signal during a period that a pulse of the register pre-signal is created.

29. The semiconductor device of claim 17, further comprising an operation pulse generation circuit configured to be synchronized with an internal clock signal and an inverted internal clock signal to generate the write pulse which is enabled when a command/address signal has a logic level combination for performing a write operation, configured to be synchronized with the internal clock signal and the inverted internal clock signal to generate the read pulse which is enabled when the command/address signal has a logic level combination for performing a read operation, and configured to be synchronized with the internal clock signal and the inverted internal clock signal to generate the register enablement signal which is enabled when the command/address signal has a logic level combination for performing a mode register read operation.

30. The semiconductor device of claim 29, wherein the operation pulse generation circuit includes:
a command decoder configured to be synchronized with the internal clock signal and the inverted internal clock signal to generate a write signal which is enabled when the command/address signal has a logic level combination for performing the write operation, configured to be synchronized with the internal clock signal and the inverted internal clock signal to generate a read signal which is enabled when the command/address signal has a logic level combination for performing the read operation, and configured to be synchronized with the internal clock signal and the inverted internal clock signal to generate a mode register read signal which is enabled when the command/address signal has a logic level combination for performing the mode register read operation; and
a pulse generation circuit configured to generate the write pulse which is enabled in response to the write signal, configured to generate the read pulse which is enabled in response to the read signal, and configured to generate the register enablement signal which is enabled in response to the mode register read signal.

31. The semiconductor device of claim 30, wherein the pulse generation circuit includes:
a first pulse generation circuit configured to generate the write pulse which is created after a predetermined period elapses from a point of time that the write signal is enabled;
a second pulse generation circuit configured to generate the read pulse which is created after a predetermined period elapses from a point of time that the read signal is enabled; and
a third pulse generation circuit configured to generate the register enablement signal including a pulse which is created after a predetermined period elapses from a point of time that the mode register read signal is enabled.

* * * * *

UNITED STATES PATENT AND TRADEMARK OFFICE
CERTIFICATE OF CORRECTION

PATENT NO. : 10,593,386 B2
APPLICATION NO. : 16/200980
DATED : March 17, 2020
INVENTOR(S) : Woongrae Kim Page 1 of 1

It is certified that error appears in the above-identified patent and that said Letters Patent is hereby corrected as shown below:

On the Title Page

Item (30) Foreign Application Priority Data:
Add --Jul. 13, 2018 (KR) ...........................10-2018-0081932--

Signed and Sealed this
First Day of September, 2020

Andrei Iancu
*Director of the United States Patent and Trademark Office*